United States Patent
Park

(10) Patent No.: US 8,183,667 B2
(45) Date of Patent: May 22, 2012

(54) EPITAXIAL GROWTH OF CRYSTALLINE MATERIAL

(75) Inventor: Ji-Soo Park, Andover, MA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/476,460

(22) Filed: Jun. 2, 2009

(65) Prior Publication Data

US 2009/0321882 A1 Dec. 31, 2009

Related U.S. Application Data

(60) Provisional application No. 61/058,542, filed on Jun. 3, 2008.

(51) Int. Cl.
*H01L 29/20* (2006.01)

(52) U.S. Cl. .............. 257/615; 438/44; 257/E33.005

(58) Field of Classification Search .......... 257/615, 257/592, 929
See application file for complete search history.

(56) References Cited

U.S. PATENT DOCUMENTS

| | | | |
|---|---|---|---|
| 7,799,592 B2 | 9/2010 | Lochtefeld | |
| 2006/0292719 A1 | 12/2006 | Lochtefeld et al. | |
| 2007/0025670 A1* | 2/2007 | Pan et al. | 385/129 |
| 2007/0054467 A1* | 3/2007 | Currie et al. | 438/458 |
| 2007/0181977 A1 | 8/2007 | Lochtefeld et al. | |
| 2008/0070355 A1 | 3/2008 | Lochtefeld et al. | |
| 2008/0073641 A1 | 3/2008 | Cheng et al. | |
| 2008/0099785 A1 | 5/2008 | Bai et al. | |
| 2008/0154197 A1 | 6/2008 | Derrico et al. | |
| 2008/0257409 A1 | 10/2008 | Li et al. | |

OTHER PUBLICATIONS

J, -S. Park (Defect reduction of selective Ge epitaxial in trenches on Si(001) substrate using aspect ratio trapping) (publish on line Feb. 2, 200).*

J. Bai (Study of the defect elimination mechanisms in aspect ratio trapping Ge growth) (published online Mar. 5, 2007).*

Kamins et al., "Kinetics of selective epitaxial deposition of $Si_{1-x}Ge_x$," Hewlett-Packard Company, Palo Alto, CA, Appl Phys. Lett. 61 (6), Aug. 10, 1992 (pp. 669-671).

* cited by examiner

*Primary Examiner* — Tony Tran
(74) *Attorney, Agent, or Firm* — Slater & Matsil, L.L.P.

(57) ABSTRACT

A device includes an epitaxially grown crystalline material within an area confined by an insulator. A surface of the crystalline material has a reduced roughness. One example includes obtaining a surface with reduced roughness by creating process parameters which result in the dominant growth component of the crystal to be supplied laterally from side walls of the insulator. In a preferred embodiment, the area confined by the insulator is an opening in the insulator having an aspect ratio sufficient to trap defects using an ART technique.

11 Claims, 10 Drawing Sheets

EPITAXIAL GROWTH OF CRYSTALLINE MATERIAL

CROSS-REFERENCE TO RELATED APPLICATIONS

The present application claims priority from U.S. provisional patent application, Ser. No. 61/058,542, filed Jun. 3, 2008, by Ji-Soo Park, incorporated by reference herein and for which benefit of the priority date is hereby claimed.

BACKGROUND OF THE INVENTION

1. Field of the Invention

The present invention relates to epitaxial growth of a crystalline material. The improved growth may occur within a confined area, such as within a opening or trench formed in an insulator.

2. Description of the Related Art

The formation of lattice-mismatched materials has many practical applications. Heteroepitaxially growth of group IV materials or compounds, and III-V, III-N and II-VI compounds on a crystalline substrate, such as silicon has many applications such as photovoltaics, resonant tunneling diodes (RTD's), transistors (e.g., FET (which can be planar or 3D (i.e., finFET), HEMT, etc.), light-emitting diodes and laser diodes. As one example, heteroepitaxy of germanium on silicon is considered a promising path for high performance p-channel metal-oxide-semiconductor (MOS) field-effect transistors (FET) and for integrating optoelectronic devices with silicon complementary MOS (CMOS) technology. Heteroepitaxially growing Ge on Si also is a path for providing a substitute for Ge wafers for many other applications such as photovoltaics, light-emitting diodes and laser diodes provided that a sufficiently high-quality Ge surface can be obtained cost-effectively. Heteroepitaxy growth of other materials (e.g., of group III-V, III-N and II-VI compounds and other group IV materials or compounds) also is beneficial for these and other applications.

However, the dislocation density of the epitaxially grown material can be unacceptably high for many applications. For example, the dislocation density of germanium directly grown on silicon can be as high as $10^8$-$10^9$ $cm^{-2}$ due to the 4.2% lattice mismatch between the two materials-unacceptable for most device applications. Various approaches to reducing the defect density have been pursued, including compositional grading, and post-epi high-temperature annealing. However, these approaches may not be optimal for integration with silicon-based CMOS technology due to requirements for thick epi-layers and/or high thermal budgets, or due to incompatibility with selective growth at a density suitable for CMOS integration.

Aspect Ratio Trapping (ART) is a defect reduction technique which mitigates these problems. As used herein, "ART" or "aspect ratio trapping" refers generally to the technique(s) of causing defects to terminate at non-crystalline, e.g., dielectric sidewalls, where the sidewalls are sufficiently high relative to the size of the growth area so as to trap most, if not all, of the defects. ART utilizes high aspect ratio openings, such as trenches or holes, to trap dislocations, preventing them from reaching the epitaxial film surface, and greatly reduces the surface dislocation density within the ART opening. FIGS. 7A and 7B respectively show a cross section and perspective view of an epitaxially grown crystalline material 140 using ART. As illustrated, a crystalline material 140 is epitaxially grown on substrate 100 (here, on the (001) surface of a silicon substrate). By confining the crystalline growth within an opening (e.g., trench) with a sufficiently high aspect ratio (e.g. 1 or greater), defects 150 formed while epitaxially growing the crystalline material 140 travel to and end at the insulator sidewalls 130. Thus, the crystalline material 140 continues to grow without the continued growth of the defects 150, thereby producing crystal with reduced defects. This technique has been shown to be effective for growing low defectivity materials such as Ge, InP and GaAs selectively on Si in trenches as wide as 400 nm and of arbitrary length—an area large enough for devices such as an FET, for example.

Selective growth behavior on $SiO_2$-patterned Si substrate is known to differ significantly from the growth on blanket substrates, due to the so-called "loading effect". Thus, even when using the same process (temperature, pressure, time, precursor gas, etc.) are used to epitaxially grow material across a large area of a substrate (blanket epitaxial growth) and on a substrate within an area confined by an insulator (e.g., on Si within a opening or trench in $SiO_2$), different results may be obtained. Growth behavior depends not only on the total area ratio of Si-to-$SiO_2$ over the wafer but also on the size of the openings of individual Si windows. It has been reported that the loading effect is reduced through a reduction of the growth pressure[9] or through an addition of HCl to the growth ambient. Other studies have focused on the pattern dependence of the growth rate and germanium content of selective SiGe. However, there are few studies on selective Ge, especially on the initial growth stage of Ge which determines the surface morphology of the layer.

When manufacturing a device which includes an active portion of the crystal material within a opening of surrounding dielectric, it is often desirable to obtain a smooth crystal surface within the opening. For example, a high surface roughness of the surface of a lower layer (e.g., a n-doped crystalline layer) would create higher variances in an interface between this lower layer and an upper layer (e.g., a p-doped crystalline layer) formed on this lower layer from one location to the next. These interface variances affect the functionality of the interface from one device to another device on the same substrate (e.g., differences in diode devices formed by p-n junctions differ from variances of the junctions, or interfaces, of the p and n crystalline materials). Thus, the same devices produced on the same substrate (e.g., same sized diodes, transistors, LEDs, LD's, etc. on the same silicon wafer) may undesirably vary in their operational characteristics. This may result in requiring higher operating tolerances and possibly device failure.

For the growth of smooth Ge layers on a blanket substrate, two-step growth, which comprises a thin low temperature buffer (330-450° C.) followed by a thick high temperature layer (600-850° C.) has been utilized. However, none of these processes were shown to be able to create smooth surfaces of Ge in a confined location, such as a opening or trench in an insulator. As noted above, the selective growth (e.g., in a opening or trench) is known to differ from growth on blanket substrates. Further, growth at the lower temperatures was performed by molecular beam epitaxy, which is currently undesirable for commercial applications.

Chemical mechanical polishing (CMP) of the selectively grown crystalline material may not be an option to smooth the surface of the crystalline material if it is not desired to grind the surrounding dielectric layer to the same height. Further, known processes which obtain acceptable surface roughness for blanket expitaxial grown materials have been found to obtain higher surface roughness for selective epitaxial grown materials.

Thus, there is a need to reduce the surface roughness of materials grown in a confined area or selectively grown. In particular, there is a need to reduce the surface roughness of crystalline materials grown in an ART opening.

SUMMARY OF THE INVENTION

Therefore, it is an aspect of one embodiment of the invention to provide an epitaxially grown crystalline material with a reduced surface roughness.

An alternative aspect, one embodiment the invention to provides a process for the low temperature growth of crystalline material. Such growth may be done with a CVD process.

In yet another aspect, one embodiment of the invention provides a process for the epitaxial growth of a crystalline material where the dominant growth component is provided by the lateral supply of the crystalline material containing species, such as from sidewalls of an insulator. The growth component of the crystalline material containing species from the growth ambient may be substantially reduced.

These aspects may be especially applicable to devices incorporating ART techniques, including but not limited to a mixed signal application device, a field effect transistor, a quantum tunneling device, a light emitting diode, a laser diode, a resonant tunneling diode and a photovoltaic device. The ART devices may have crystalline material epitaxially grown in openings or confined areas with an aspect ratio (depth/width)>1, or otherwise suitable for trapping most defects.

Additional aspects and utilities of the invention will be set forth in part in the description which follows and, in part, will be obvious from the description, or may be learned by practice of the invention.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which:

FIG. 1, comprising FIG. 1(a) illustrates the AFM at the edge of 6 mm×6 mm Si window in oxide-field which was removed using a dilute HF; FIG. 1(b) illustrates the AFM at 80 μm from this edge and FIG. 1(c) illustrates the AFM at 150 μm from oxide-field. FIG. 1(d) illustrates a 5 μm×5 μm AFM of a Ge layer grown at 600° C. for 15 seconds on blanket Si.

FIG. 2 comprises FIGS. 2(a)-2(f).

FIG. 3 comprises FIGS. 3(a)-3(f).

FIG. 5, comprising

DETAILED DESCRIPTION OF THE PREFERRED EMBODIMENTS

Figures 1A, 1C:
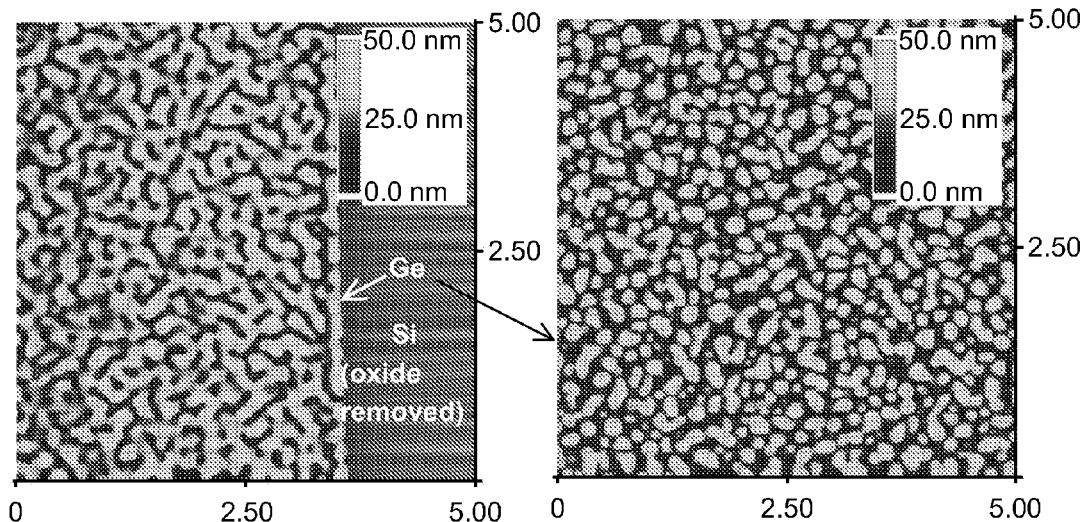
FIGS. 1(a)-1(d), illustrates 5 μm×5 μm AFM of Ge layers grown at 600° C. for 15 seconds.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Figure 6A:
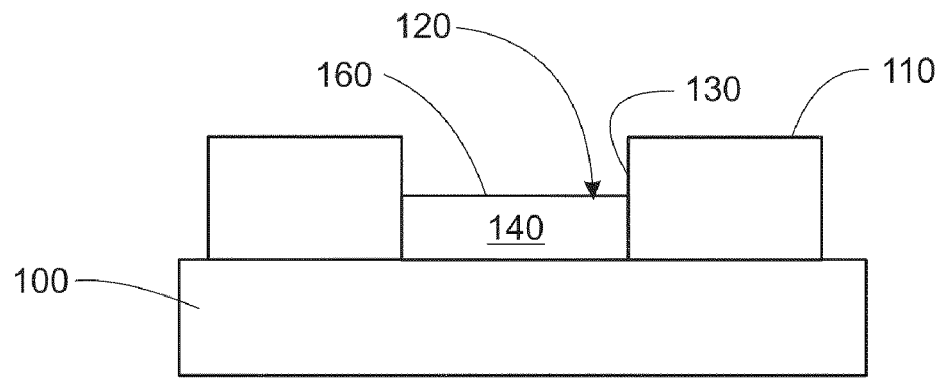
FIGS. 6A, 6B and 6C illustrate example configurations of a crystalline material grown on a substrate according to the invention.

An embodiment of the invention is directed to a device including an epitaxially grown crystalline material in a opening in an insulator. FIG. 6A shows one example, illustrating a cross section of a portion of the device. As shown in FIG. 6A, the example includes a crystalline material 140 grown on a substrate 100 in a opening 120 defined in an insulator 110. The substrate 100 may be a crystalline material such as silicon, Ge or sapphire. Insulator 110 is preferably a non-crystalline material such as $SiO_2$. The crystalline material at least at some stage in during its growth has a surface, for example surface 160, below the top surface of insulator 110. The surface 160 has a surface roughness Rms (root mean square, also sometimes denoted as "Rrms" and "Rq") of less than or equal to 5 nm. The surface roughness (Rms) of surface 160 may be less than or equal to 3 nm, or less than or equal to about 1 nm. The surface roughness (Rms) of surface 160 may also be no greater than 0.55 nm In one example, the width of the opening 120 may be 400 nm or less, 350 nm or less or 200 nm or less, 100 nm or less or 50 nm or less; these sizes have been shown to be effective for ART (of course these sizes do not need to be used with to ART). Alternatively, the width of the opening may be 5 um or less. In another alternative, the width of the opening may be 1 um or less. The opening may be as great as 200 um or less, as shown by the following description. The opening may be formed as a trench (with the length of the trench running perpendicular to the cross section shown in FIG. 6A) in which case the width would be considered to be perpendicular to its length and height. The length of the trench may be arbitrary. Alternatively, the length of the trench may be substantially larger than the width of the trench, for example greater than 10 times larger, or greater than 100 times larger. In one example, the length of the trench is 6 mm.

It is preferred, but not necessary, that the opening 120 is used to trap defects when epitaxially growing the crystalline material 140 using ART (aspect ratio trapping) techniques. In such a case, the aspect ratio (AR-height/width) may be greater than 1, although it possible for the aspect ratio to be lower in ART devices, for example as low as 0.5. (Aspect ratio "AR" is defined for trenches as the ratio of the trench height/ trench width.) Further details of example ART devices and ART techniques in which this invention may be incorporated may be found in U.S. patent application Ser. Nos. 11/436,198 filed May 17, 2006, 11/493,365 filed Jul. 26, 2006 and 11/852,078 filed Sep. 7, 2007, all of which are hereby incorporated by reference.

Figure 6B:
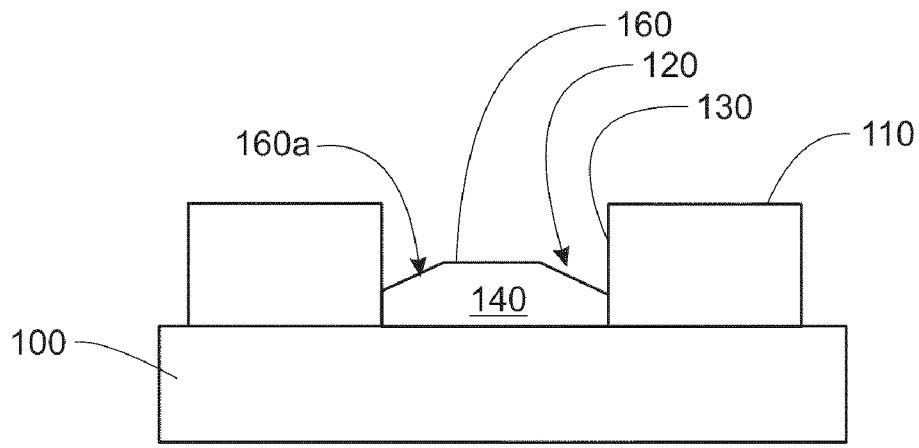
Figure 6C:
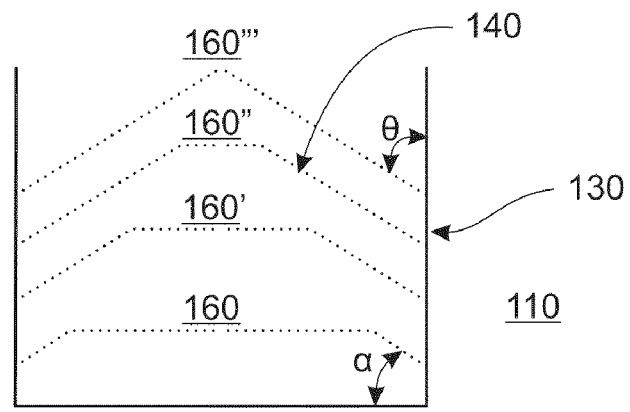
Figure 7A:
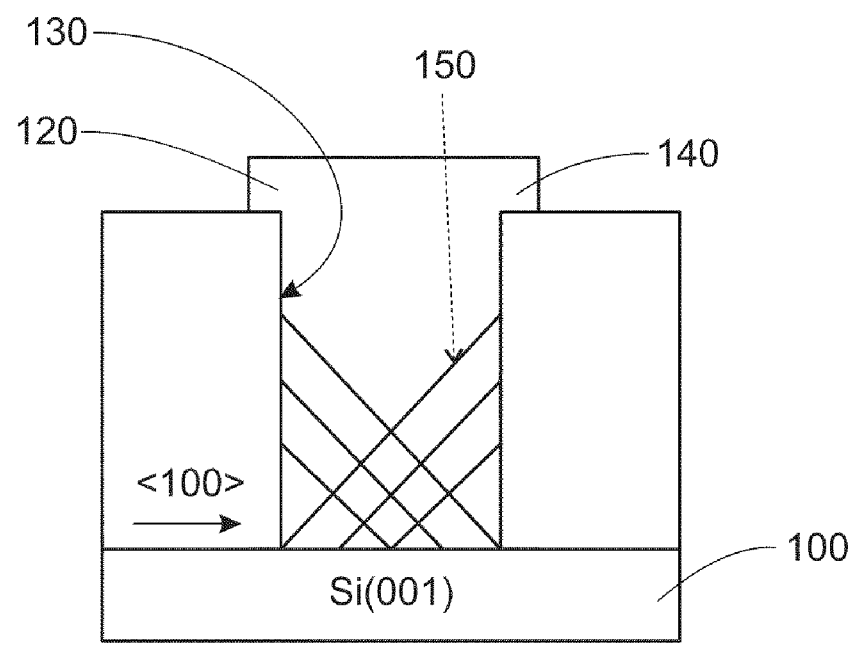
FIGS. 7A and 7B respectively show a cross section and perspective view of an epitaxially grown crystalline material 140 using ART.
Figure 7B:
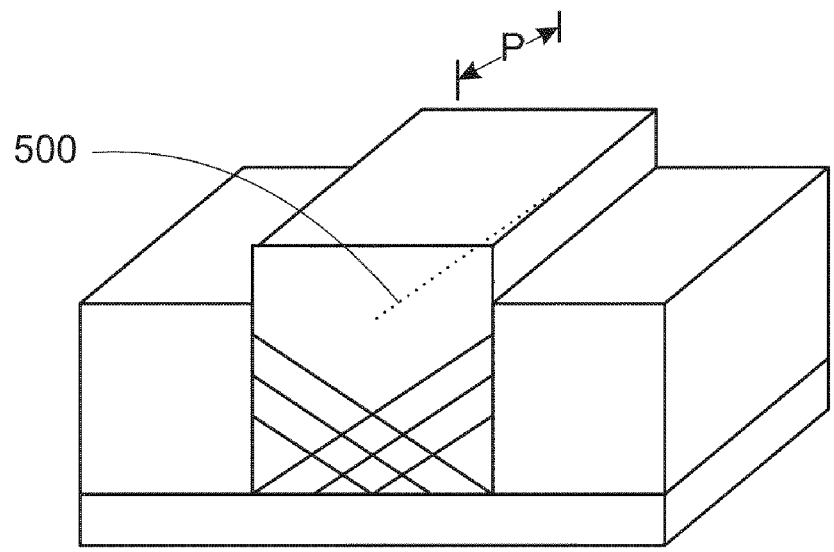

FIG. 6A illustrates the crystalline material 140 with a continuous non-faceted surface extending between the sidewalls 130 of insulator 110 which form opening 120. Alternatively, the surface 160 of crystalline material 140 may include facets 165 as shown in FIG. 6B. "Facet" is used herein to denote any major surface of the epitaxial material that is not parallel to an underlying surface of substrate surface 100. Further, as shown in FIG. 6C, the surface of crystalline material 140 may only include of faceted surfaces 165 (i.e., not include any surface parallel to the surface of substrate 100), as exemplified by surface 160'''. Unless otherwise noted, when measuring surface roughness of surfaces including facets, deviation of the surface height due to the faceting is included in calculating surface roughness for the faceted surface.

FIG. 6C also illustrates an implementation of the invention where additional epitaxial growth of the crystalline material 140 occurs above the initial surface 160. FIG. 6C shows surfaces 160', 160" and 160''' subsequently grown above an initial surface 160. These additional surfaces may grow in a single epitaxial growth process with no change to process parameters. Alternatively, the process parameters may be changed to alter the characteristics of the subsequently grown crystalline material 140. For example, doping levels and/or doping type may be altered during the growth process (e.g., to obtain a p-n junction or a p-i-n quantum device). In such an implementation, one or more of the surfaces (in this example, one or more of surfaces 160, 160', 160", 160''') may have the surface roughness parameters described above with respect to FIG. 6A. It is also possible to use several different processes to obtain the multiple surfaces. Although not shown in FIGS. 6A-6C, it is of course possible to form (epitaxially grow or deposit by sputtering or CVD) a different material altogether on surface 160. As is obvious from this discussion, in this disclosure, a "surface" of an epitaxially grown crystalline material indicates a boundary of the epitaxially grown material during some period of its growth. Such a "surface" does not cease to exist simply due to the forming of additional material on this surface, whether or not such additional material is homogeneous with the material on which it is deposited, and whether or not the additional material is deposited in the same process with the same process parameters The surfaces 160 of the crystalline material 140 of the examples illustrated in FIGS. 6A, 6B and 6C are all below the height of the top surface of insulator 110. In another embodiment of the invention (not shown), one or more the surfaces 160 of the crystalline material may partly or fully extend past the top surface of insulator 110. The one or more surfaces obtained from the epitaxial growth of the crystalline material may have a surface roughness Rms less than or equal to 5 nm, may be less than or equal to 3 nm, or may be less than or equal to about 1 nm. The surface roughness of surface of this/these surface(s) 160 may also be no greater than 0.55 nm.

The substrate 100 in the above examples may include a group IV element or compound, such as germanium and/or silicon, e.g., (100) silicon. The crystalline material 140 may include at least one of a group IV element or compound, a III-V or III-N compound, or a II-VI compound. Examples of group IV elements include Ge, Si and examples of group IV compounds include SiGe (Examples of III-V compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), indium antimonide (InSb), and their ternary and quaternary compounds. Examples of III-N compounds include aluminum nitride (AlN), gallium nitride (GaN), indium nitride (InN), and their ternary and quaternary compounds Examples of II-VI compounds includes zinc selenide (ZnSe), zinc telluride (ZnTe), cadmium selenide (CdSe), cadmium telluride (CdTe), zinc sulfide (ZnS), and their ternary and quaternary compounds.

Figure 8:
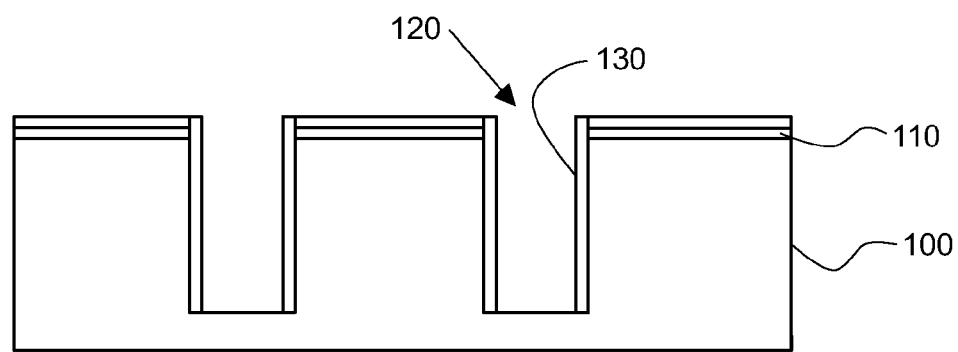
FIG. 8 illustrates another example of the confined area in which crystalline material may be epitaxially grown.

The layer of insulator need not be formed as a substantially planar layer. For example, the insulator may be formed of a thin layer which conforms to an undulating surface of the substrate on which it is deposited. FIG. 8 illustrates on example including a substrate which has openings/trenches etched into the substrate. An insulating layer 110 has been formed across the substrate 100 conforming to the surface topography of the etched substrate 100. The insulating layer 110 has portions at the bottom of the openings/trenches to expose portions of the substrate 100 on which the crystalline material will be grown. In this case, the sidewalls of the insulator are formed from the outer surface of the insulator 110 after its deposition and are not formed by a separate photolithography and etch process.

The following description in connection with FIGS. 1-4 explains examples of how the surfaces of the crystalline material grown within a confined space (e.g., in opening 120 in insulator 110) may be obtained with reduced surface roughnesses. Although this description is in connection with specific materials and process parameters, it will be apparent that the description is exemplary only, and should not be considered to limit the invention to such materials and process parameters.

The following materials and process parameters were used for all of the Ge grown as discussed in connection with FIGS. 1-5. The starting substrates used in this work were crystalline silicon, 200 mm diameter, p-type, and (001) oriented. A 500-nm-thick thermal oxide was grown on the substrate. The oxide layer was patterned into trenches along [110] direction of the silicon substrate having 350 nm width and 6 mm length. A section of the wafer had 6 mm×6 mm exposed Si area in the oxide-field which was used to characterize selective Ge growth as a function of the distance from the oxide-field. The trenches were formed using conventional photolithography techniques and a reactive ion etching (RIE) step. The patterned substrates were then cleaned in Pirana, SC2, and dilute HF solutions sequentially. Removal of fluorocarbon residues caused by RIE was accomplished using a 25-nm-thick sacrificial oxidation and subsequent HF oxide etch. The final trench height was 490 nm after this cleaning procedure. Ge layers were grown by chemical vapor deposition (CVD) on the exposed Si substrate (either in the trenches, in the 6 mm×6 mm section, or on a blanket Si substrate (i.e., a bare Si wafer)) in an industrial ASM Epsilon E2000 system. This CVD system is a horizontal, cold-wall, single wafer, load-locked reactor with a lamp-heated graphite susceptor in a quartz tube. Directly prior to growth, the substrates were cleaned in a diluted HF solution and rinsed in DI (deionized) water. The substrates were loaded into the growth chamber and baked in H2 for 1 minute at 870° C. The pressure during the bake was set the same value as used in the subsequent growth step, 80 Torr. The growth step used a 30 sccm germane (GeH4) source gas flow diluted to 25% in a 20 slm hydrogen carrier gas flow. 100 ppm B2H6 and 1000 ppm PH3 balanced in H2 were used for in-situ boron and phosphorus doping, respectively. As discussed in more detail below, growth temperature was varied from 350° C. to 600° C., as was the time for growth.

After the Ge growth, the 490-nm-thick oxide which formed the trenches was removed using a diluted HF to enable material characterization. The sample roughness was characterized by tapping-mode atomic force microscopy (AFM) with a Veeco Dimension 3100. The boron and phosphorous doping level was measured with secondary ion mass spectrometry (SIMS) with an IMS 6-f using an oxygen and cesium ion beam, respectively.

Figures 1B, 1D:
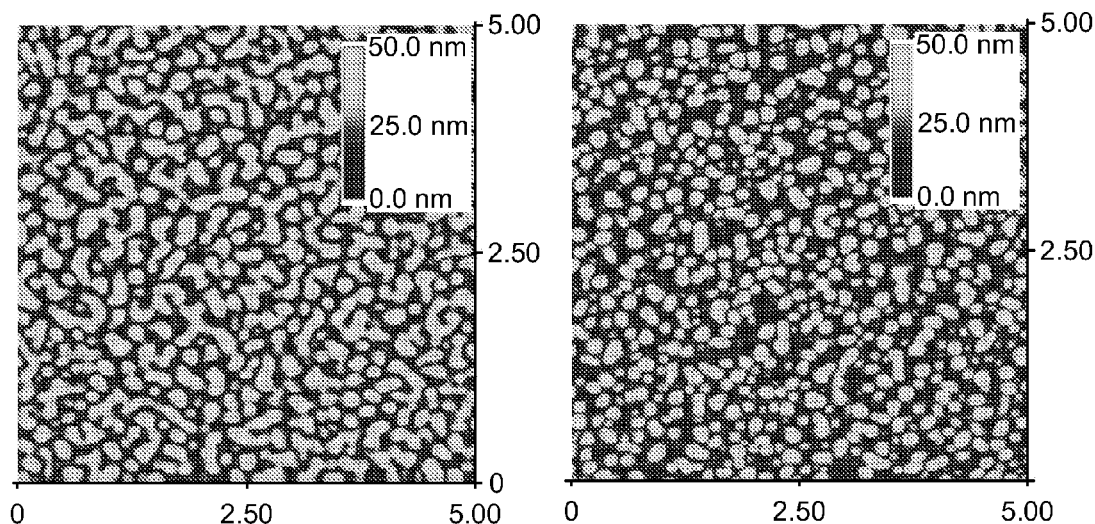

FIGS. 1(a)-1(c) show the AFM images of Ge layers grown at 600° C. for 15 seconds on the very edge of 6 mm×6 mm Si window in the oxide-field (FIG. 1(a)) and at 80 μm (FIG. 1(b)) and 150 μm (FIG. 1(c)) distances from the oxide-edge. An AFM image of Ge grown at 600° C. for 15 seconds on blanket Si is also shown in FIG. 1(d) for comparison. Close to the oxide-field, the Ge islands are all connected to one another [FIG. 1(a)]. At greater distances from the oxide-field, Ge islands become more discrete and, as a result, the surface microstructure becomes more similar to the one on blanket Si [FIGS. 1(b)-1(d)]. However, even the surface microstructure of Ge at 150 μm distances from the oxide [FIG. 1(c)] is slightly different from that on blanket Si [FIG. 1(d)], which has smaller and more discrete islands. These results indicate that a significant amount of Ge-containing species for selective Ge growth is laterally supplied from the oxide-field. In addition, the lateral transport of Ge-containing species reaches at least on the order of ~100 μm range at these growth conditions. This value is similar with the one obtained from selective InGaAs growth in which the variation of local In composition was on the order of 100 μm range depending on growth pressure (see T. I. Kamins, D. W. Vook, P. K. Yu, and J. E. Turner, Appi. Phys. Lett., 61, 669 (1992)). It was claimed that the lateral diffusion of reactants which caused local variation of In composition in InGaAs layer was through the gas phase, not on the surface. In selective SiGe growth, the growth rate uniformity increases at lower pressure where gas phase diffusion is more dominant indicating that Ge might be supplied from the oxide through gas phase diffusion.

Figure 2A:
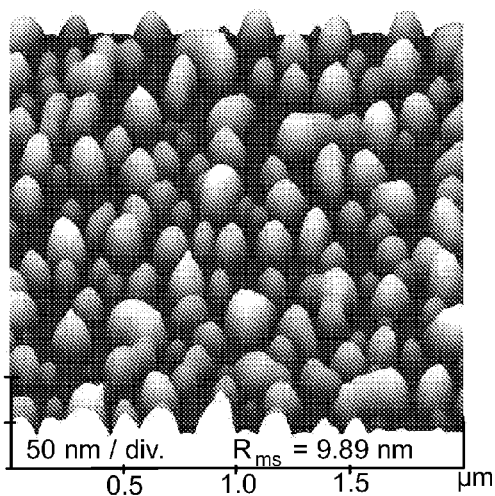
FIGS. 2(a)-(c) illustrates three-dimensional AFM images of Ge layers grown at 600° C. on blanket Si for 15 sec (FIG. 2(a)), 90 sec (FIG. 2(b)), 180 sec (FIG. 2(c)).
Figure 2D:
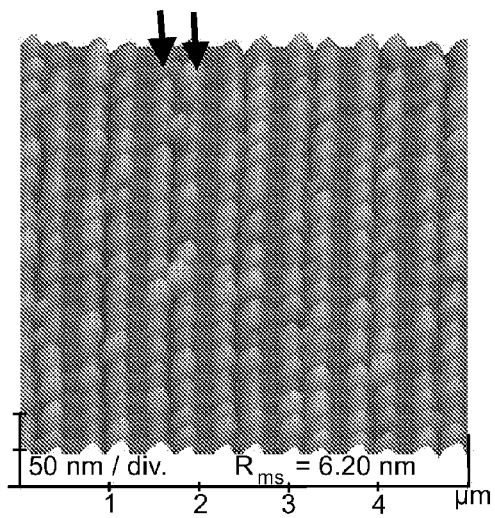
FIGS. 2(d)-(f) illustrate three-dimensional AFM images of Ge layers grown at 600° C. on Si within 350-nm-wide oxide-trenches after oxide removal for 15 sec (FIG. 2(d)), 90 sec (FIG. 2(e)), and 180 sec (FIG. 2(f)). Scan size of growth on blanket Si (FIGS. 2(a)-(c)) is 2 μm×2 μm and scan size of growth within oxide trenches (FIGS. 2(d)-(f)) is 5 μm×5 μm. Vertical scale and root-mean-square roughness (Rms) are shown on the left and right bottom of each image, respectively. Rms of the Ge on oxide-trench was calculated only on the Ge area and did not include Si where oxide was removed.
Figure 2B:
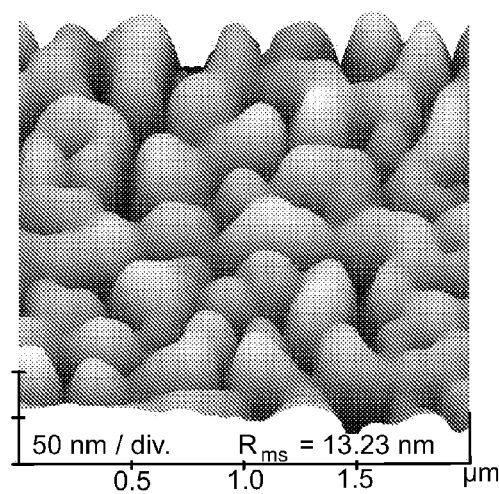
Figure 2E:
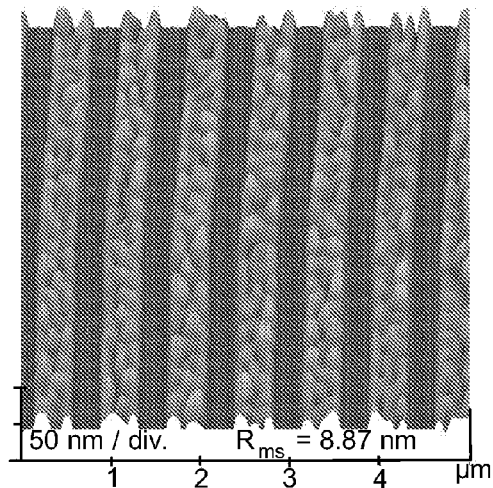
Figure 2C:
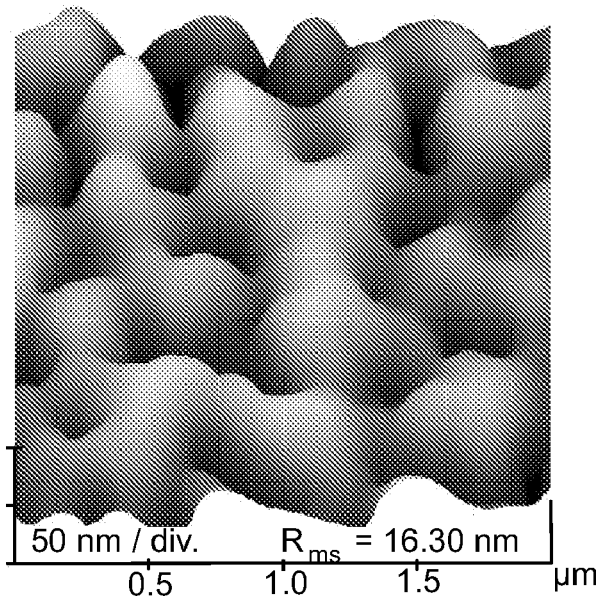
Figure 2F:
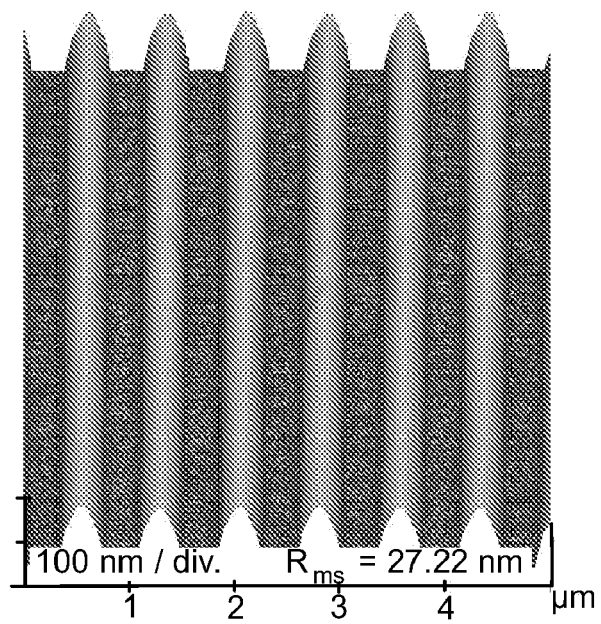

FIGS. 2(a)-2(c) illustrate the surface morphology of Ge layers grown at 600° C. on blanket Si substrates. FIGS. 2(d)-2(f) illustrate the surface morphology of Ge layers grown at 600° C. on Si located at the bottom of the oxide-trench described above. FIGS. 2(a) and 2(d) illustrate results for Ge growth for 15 seconds. FIGS. 2(b) and 2(e) illustrate Ge growth for 90 seconds. FIGS. 2(c) and 2(f) illustrate Ge growth for 180 seconds. A 15 sec growth of Ge on blanket Si at 600° C. exhibits an island growth [FIG. 2(a)] and longer growth shows the coalescence of Ge islands causing a rougher surface [FIGS. 2(b)-2(c)]. This island growth on blanket Si substrate has been reported to be due to the relaxation of misfit strain between Ge and Si, which leads to three-dimensional islands from initial, pseudomorphic, and two-dimensional wetting layers.

On the oxide-trench Si substrate (where the oxide sidewall was removed after growth using a dilute HF), Ge islands were preferentially nucleated and grown at the edge of the trenches after 15 sec growth as indicated by arrows in FIG. 2(d). The lateral diffusion length of Ge containing species from the oxide sidewall was in the range of ~100 μm as discussed above. Thus, the selective Ge growth inside the 350-nm-wide trenches has a substantial component provided by the lateral supply of Ge-containing species from the oxide sidewall, in addition to a growth component due to direct supply of Ge-containing species from the growth ambient. The preferential formation of Ge islands at the edge of trench adjacent the oxide sidewalls is consistent with previous reports showing that Ge dots grown at 700° C. were mainly nucleated at the boundary of SiO2 window. It has been ascribed to the tensile strained Si at the edge of the window claiming that the higher thermal expansion coefficient of Si than that of SiO2 can make Si tensile strained near the edge and compressively strained near the center when cooled from higher bake temperature to the growth temperature. Due to the coalescence of these islands preferentially formed on the edge of the trench, Ge layer in the trench becomes rougher (Rms=8.87 nm) after longer growth [FIG. 2(e)]. And further growth resulted in (111) and (311) facet formation as shown in FIG. 2(f), resulting in a surface roughness of Rms=27.22 nm.

Figure 3A:
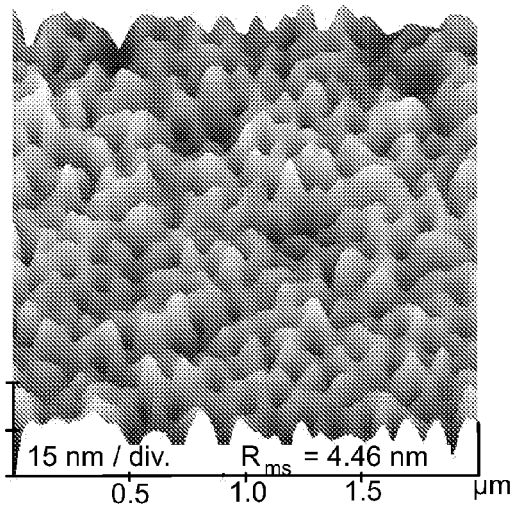
FIGS. 3(a)-(c) illustrate three-dimensional AFM images of Ge layers grown at 400° C. on blanket Si for 270 sec (FIG. 3(a)), 360 sec (FIG. 3(b)), 540 sec (FIG. 3(c)).
Figure 3D:
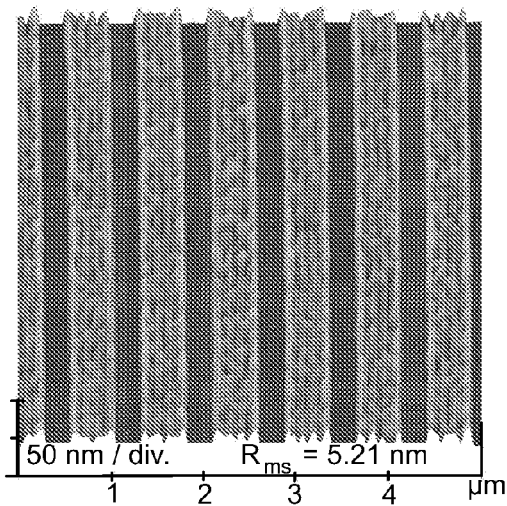
FIGS. 3(d)-(f) illustrate three-dimensional AFM images of Ge layers grown at 400° C. on Si within 350-nm-wide oxide-trenches after oxide removal for 270 sec (FIG. 3(d)), 360 sec (FIG. 3(e)), and 540 sec (FIG. 3(f)). Scan size of growth on blanket Si (FIGS. 3(a)-(c)) is 2 μm×2 μm and scan size of growth within oxide trenches (FIGS. 3(d)-(f)) is 5 μm×5 μm. Vertical scale and root-mean-square roughness (Rms) are shown on the left and right bottom of each image, respectively. Rms of the Ge on oxide-trench was calculated only on the Ge area and did not include Si where oxide was removed.
Figure 3B:
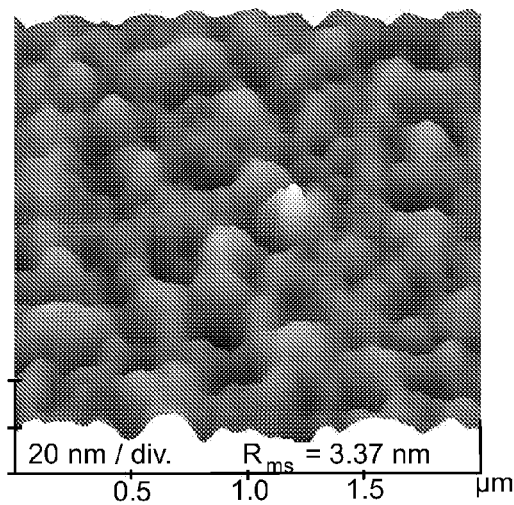
Figure 3E:
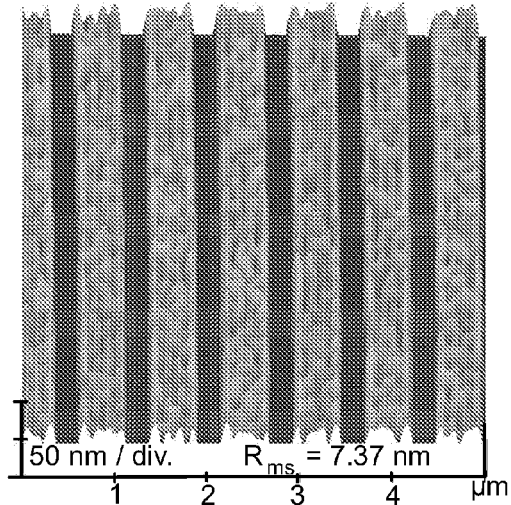
Figure 3C:
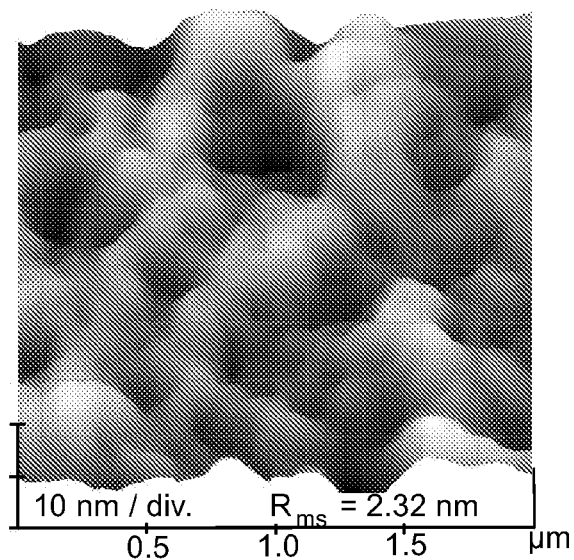
Figure 3F:
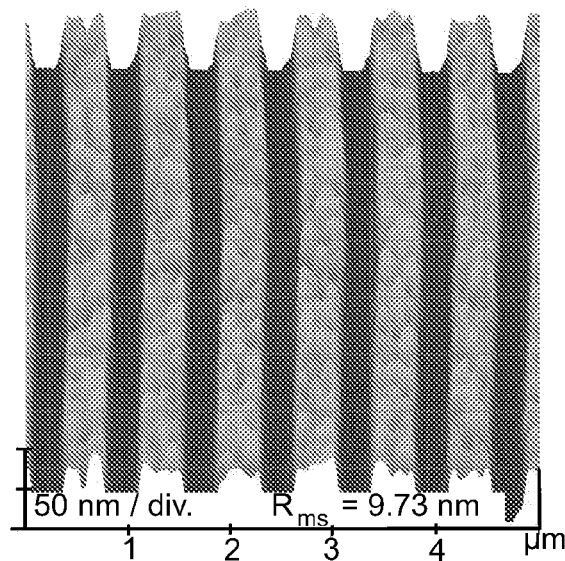

FIGS. 3(a)-(c) illustrate the surface morphology of Ge layers grown at 400° C. on blanket Si substrates for time periods of 270 seconds, 360 seconds and 540 seconds, respectively. FIGS. 3(d)-3(f) illustrate the surface morphology of Ge layers grown at 400° C. on Si located at the bottom of the oxide-trench described above for time periods of 270 seconds, 360 seconds and 540 seconds, respectively. Ge layer grown on blanket Si at 400° C. shows higher island density with smaller size than the one at 600° C. [FIG. 3(a)]. This may be attributed to a reduced surface mobility at lower temperature at which Ge atoms are less likely to diffuse to existing islands due to a low mobility but clustering to form a new nucleus. The 400° C. growth requires longer growth time for the coalescence of islands due to a lower growth rate and a longer incubation time. As a result the surface roughness becomes significantly lower as compared to 600° C. growth. This is shown in FIGS. 3(b) and (c) where a higher density of smaller islands lead to a lower surface roughness as the growth proceeds resulting in surface roughness Rms of 3.37 and 2.32 respectively, lower than the surface roughness Rms of 4.46 of FIG. 3(a).

The oxide-trench Si substrates, the preferential island formation at the edge of the trench was notably reduced compared to 600° C. However, longer growth of Ge layers inside the trench at 400° C. results in even rougher surface. As shown in surface roughness increases from Rms surface roughness of 5.21 nm (FIG. 3(d)) to 7.37 nm (FIG. 3(e)) to 9.73 nm (FIG. 3(f)) with increased growth times (from 270 seconds, to 360 seconds and 540 seconds). This is in contrast to the growth on blanket Si which leads to smoother surface with thicker layer [FIGS. 3(a)-3(c)].

These results show that Ge growth inside the oxide-trench, where the lateral supply of Ge is dominant, does not show smooth surfaces at the initial stage of growth at 400° C. unlike on blanket Si. To the contrary, Ge surface roughness inside the oxide-trench becomes higher as it gets thicker. On oxide-trench Si, the lateral diffusion of Ge-containing species dominates in the entire area of the trench due to its small size. Thus, the increased growth rate resulting from the lateral supply of Ge-containing species inside the small trench might cause rougher surface as it gets thicker.

Figure 4A:
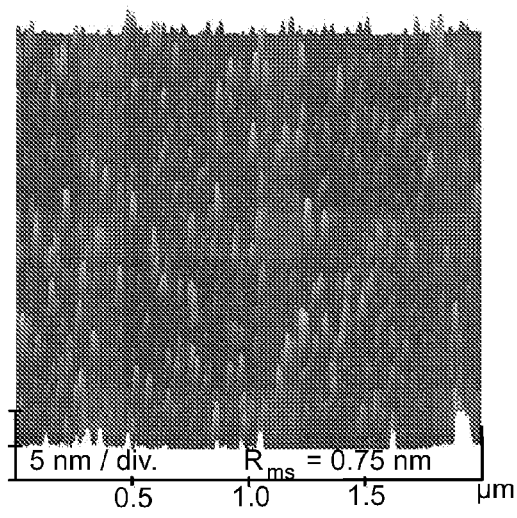
FIGS. 4(a) and (b) illustrate three-dimensional AFM images of Ge layers grown at 350° C. on blanket Si for 750 sec (FIG. 4(a)) and 2000 sec (FIG. 4(b)).
Figure 4C:
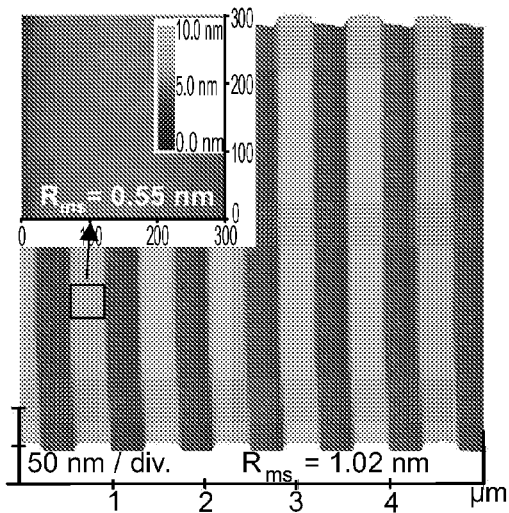
FIGS. 4(c) and (d) illustrate three-dimensional AFM images of Ge layers grown at 350° C. on Si within 350-nm-wide oxide-trenches after oxide removal for 320 sec (FIG. 4(c)) and 2000 sec (FIG. 4(d)). Scan size of growth on blanket Si (FIGS. 4(a) and (b)) is 2 μm×2 μm and scan size of growth within oxide trenches (FIGS. 4(c) and (d)) is 5 μm×5 μm. Vertical scale and root-mean-square roughness (Rms) are shown on the left and right bottom of each image, respectively. Rms of the Ge on oxide-trench was calculated only on the Ge area and did not include Si where oxide was removed. The inset in FIG. (c) is a 300 μm×300 μm AFM image obtained on Ge inside the trench.
Figure 4B:
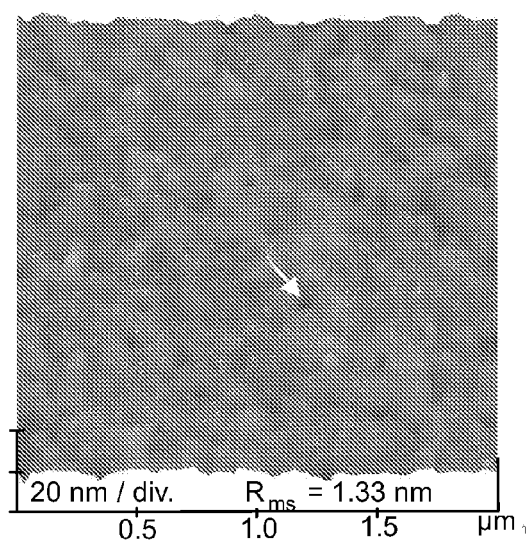
FIG. 4 comprises FIGS. 4(a)-4(d).
Figure 4D:
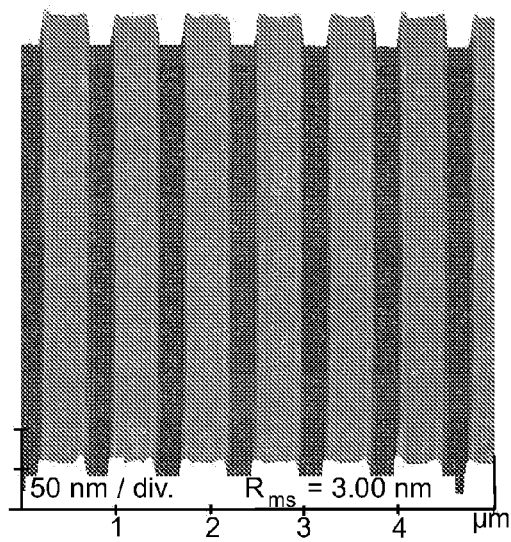

Further reducing the growth temperature to 350° C. [FIGS. 4(a)-4(d)] gives very interesting results. FIGS. 4(a) and 4(b) illustrate the surface morphology of Ge layers grown at 350° C. on blanket Si substrates for time periods of 750 seconds and 2000, respectively. FIGS. 4(c) and 4(d) illustrate the surface morphology of Ge layers grown at 350° C. on Si located at the bottom of an oxide-trench as described above for time periods of 320 seconds and 2000 seconds, respectively. At this low temperature only very limited amount of Ge is thermally decomposed and the growth rate is impractically low with a long incubation time on blanket Si. After Ge growth as long as 750 sec, only small and discrete islands were found on blanket Si substrate as shown in FIG. 4(a). After 2000 sec of growth, most-coalesced islands have formed but there are still some pits as indicated by an arrow in FIG. 4(b). The 350° C. growth has far smaller size and higher density of Ge islands than the ones at higher temperatures.

However, on the oxide-trench Si substrate, only 320 sec growth at 350° C. shows a continuous Ge layer inside the trench with uniform thickness [FIG. 4(c)]. Interestingly, its surface is extremely smooth and featureless as shown in the inset of FIG. 4(c) (Rms=1.02 overall, Rms=0.55 nm within the 300 um×300 um inset, which is an area substantially equal to the trench width squared). The higher overall Rms value reflects variations of Ge surface height from one trench to another, or along the length of the trenches. And the longer growth in FIG. 4(d) shows much a smoother layer with an Rms=3.00 nm compared to 400° C., although there is a slight pileup at the edge. It is worth noting that selectively grown Ge on oxide-trench at 350° C. results in an extremely smooth layer with uniform thickness and higher growth rate compared to the one on blanket Si. This shows that initial growth behavior on blanket and oxide-trench Si substrates are significantly different, which understood to result from the dominant supply of Ge-containing species from the oxide.

These examples show that by lowering the growth temperature to a level impracticable for blanket growth, not only is it possible to obtain significant growth in confined areas (openings in insulators over the crystalline substrate), but it is preferable in order to obtain a surface with reduced roughness. In this example, typical Ge growth temperatures are higher than 400° C., but by growing the Ge in confined areas at a temperature lower than 400° C. (here at 350° C.), substantial growth of Ge with a reduced surface roughness can be obtained within the confined area. For example, when selectively growing Ge such as thin strained Ge growth on SiGe for higher mobility on ART, the initial growth behavior of selective Ge should be considered in addition to the traditional loading effect to obtain a reduced surface roughness Ge layer.

As previously noted, growth on the blanket silicon substrate in FIGS. 4(a) and 4(b) is dominated by the component of direct supply of Ge-containing species from the growth ambient. Since the silicon substrate within the oxide trenches will also be directly exposed to the Ge growth ambient, the Ge within the trenches should also have some growth component from the direct supply of Ge-containing species from the growth ambient. However, this component of growth will be minor in the trench Ge growth. The Ge growth in the oxide trenches is dominated by the component of the lateral supply of Ge-containing species for the oxide sidewall. We can estimate the relative contribution of the direct exposure component to the lateral supply component by estimating growth rates of FIGS. 4(a) and 4(b) (growth component from direct exposure to Ge-containing species only) to those of FIGS. 4(c) and 4(d) (growth components due to direct exposure and lateral supply of Ge-containing species).

The thickness of the Ge layers in FIGS. 4(a) and 4(b) can be estimated to be about ~1 nm and ~5 nm, respectively. It should be noted that in FIG. 4(a) there are only Ge islands and continuous layers were not even formed due to low growth rate, but based on the area density of the islands it was estimated to be about 2 equivalent monolayers of Ge, which corresponds to ~1 nm thickness. The thickness of the Ge layers in FIGS. 4(c) and 4(d) is about 15 nm and 55 nm, respectively. For FIG. 4(a), the average growth rate was estimated to be 1 nm/750 sec=0.0013 nm/sec; for FIG. 4(b), the average growth rate was estimated to be 5 nm/2000 sec=0.0025 nm/sec; for FIG. 4(c), the average growth rate was estimated to be 15 nm/320 sec=0.0469 nm/sec; and for FIG. 4(d), the average growth rate was estimated to be 55 nm/2000 sec=0.0275 nm/sec. It should be noted that growth rate is not constant over the growth time since there is an incubation time before materials are formed during growth. Considering FIG. 4(c) as compared to FIG. 4(a), it can be determined that the component of growth due to the laterally supplied Ge containing species is over 35 x's than that of the component of growth due to direct exposure to the growth ambient. Considering the growth rates of FIGS. 4(b) and 4(d), it can be determined that the component of growth due to the laterally supplied Ge containing species is still over 10 x's than that of the component of growth due to direct exposure to the growth ambient.

While these examples are directed to the CVD growth of germanium on silicon, other materials may be used. For example, when epitaxially growing by CVD compounds of Group III (Al, Ga, In) and Group V (P, As) such as GaAs, AlGaAs, InGaAs, InAlAs, InGaAlAs, InP, GaP, InGaP, InAlGaP etc., a growth temperature of 500-800° C. is normally used to obtain sufficient growth rates on a blanket substrate. According to a further example, to reduce surface roughness of these materials when grown in a trench, it is preferred to grow these materials by CVD at a temperature less than 500° C., at less than about 450° C. or less than about 400° C.

As another example, compounds of Group III (Al, Ga, In) and Group V (Sb) such as GaSb, AlSb and InSb are epitaxially grown by CVD on a blanket substrate with a growth temperature in the range of 400-700° C. According to a further example, to reduce surface roughness of these materials when grown a confined area such as an opening in a opening or trench in an insulator, it is preferred to grow these materials by CVD at a temperature less than 400° C., at less than about 350° C. or less than about 300° C.

As another example, Group II-N compounds are epitaxially grown by CVD on a blanket substrate with a growth temperature in the range of 500-1100° C. According to a further example, to reduce surface roughness of these materials when grown a confined area such as an opening in a opening or trench in an insulator, it is preferred to grow Group III-N compounds by CVD at a temperature less than 500° C., at less than about 450° C. or less than about 400° C.

As another example, Group II-VI compounds are epitaxially grown by CVD on a blanket substrate with a growth temperature in the range of 250-600° C. According to a further example, to reduce surface roughness of these materials when grown a confined area such as an opening in a opening or trench in an insulator, it is preferred to grow Group II-VI compounds by CVD at a temperature less than 250° C., at less than about 220° C. or less than about 200° C.

As another example, Group IV elements and compounds are epitaxially grown by CVD on a blanket substrate with a growth temperature in the range of 400-1000° C. According to a further example, to reduce surface roughness of these materials when grown a confined area such as an opening in a opening or trench in an insulator, it is preferred to grow these Group IV materials by CVD at a temperature less than 400° C., at less than about 350° C. or less than about 300° C.

When epitaxially growing the Group IV, III-V, III-N and II-VI materials in accordance with the above, it is preferred, but not necessary that the surface roughness is reduced as described above.

Figure 5A:
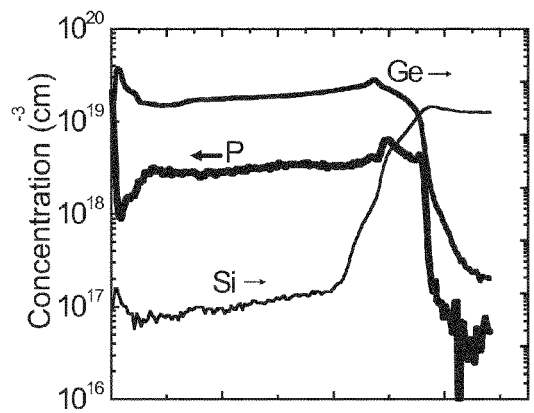
FIGS. 5(a)-5(d), illustrates SIMS depth profiles of (a) phosphorus and (b) boron in Ge inside the trenches after oxide removal and (c) phosphorus and (d) boron in Ge on blanket Si. Ge layers were deposited in two-steps at 400° C. for 540 sec and then at 600° C. for 1050 sec.
Figure 5C:
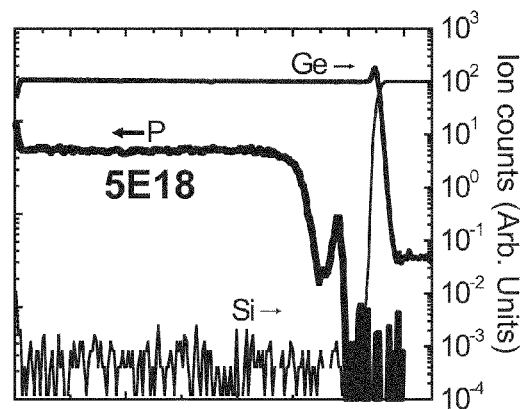
Figure 5B:
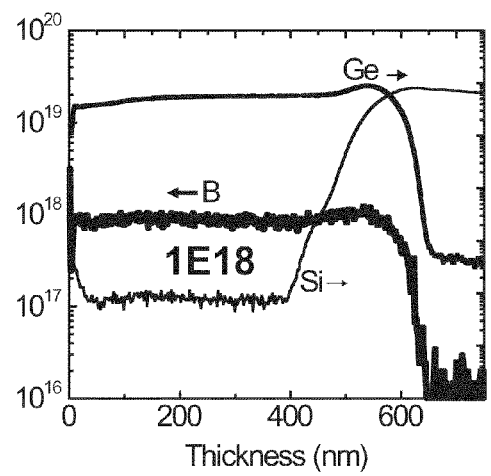
Figure 5D:
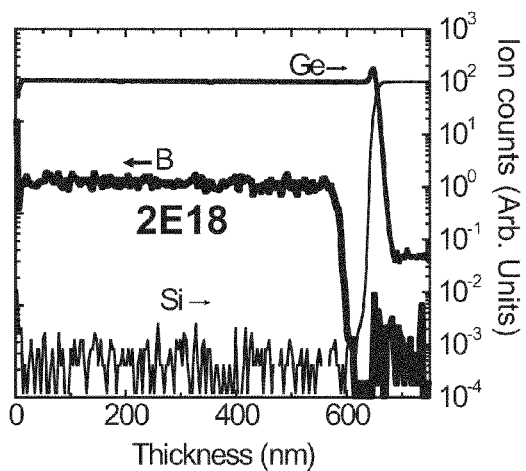

When epitaxially growing Ge with a dominant growth component from the lateral supply of Ge containing species from the sidewalls of the oxide trenches, doping is non-significantly effected as compared to Ge growth on a blanket substrate (with a dominant growth component due to the direct supply of Ge-containing species from the growth ambient). In-situ doping, boron and phosphorus doping levels were evaluated on Ge grown on oxide-trench Si and on blanket Si. To measure the doping level of Ge inside the trench, 500 nm thick boron- or phosphorus-doped Ge was grown inside the trench. The Ge was grown by CVD (using the same shared process parameters discussed above with respect to FIGS. 1-4) for 540 sec at 400° C. and then for an additional 1800 seconds at an increased temperature of 600° C. Thickness of oxide trench is 490 nm and Ge was slightly over oxide but not coalesced. The oxide was removed by a diluted HF as it was done for previously discussed AFM analysis. Phosphorus and boron SIMS depth profiles of Ge inside the trenches are shown in FIGS. 5(a) and 5(b), respectively. Depth profiles of Ge on blanket Si grown at the same conditions are shown for comparison in FIGS. 5(c) and 5(d). For the SIMS analysis, the incoming sputtering ion beam was set at an angle of 60 degree from the surface normal of the Si so that the Ge pillars are sputtered at least for the initial part of the pillar. The channel to detect signals was oriented perpendicular to the ion beam. And the dopant species are normalized point by point to the Ge signal intensity to quantify the signals. According to the data, both boron and phosphorus doping levels of Ge inside the trench were roughly half of those on blanket grown at the same conditions. There may be a doping measurement error close to the Si surface due to inconsistencies in the sputtering rate if the shape of the germanium pillars changes during sputtering process. However, this analysis demonstrates that the doping level in trenches does not show a significant difference of more than an order of magnitude from that on blanket silicon for identical growth process parameters.

As noted above, this invention has a wide variety of applications. While not limited to ART technology, this invention has many applications within ART technology. For example, use of this invention may be used to create strained Ge over a SiGe alloy grown in a opening within an insulator. One or both of the Ge and SiGe layers may be grown in accordance with the invention and/or may have a surface of reduced roughness. A wide variety of devices may incorporate the invention. While not limiting to these devices, the invention may be particularly applicable to mixed signal applications, field effect transistors, quantum tunneling devices, light emitting diodes, laser diodes, resonant tunneling diodes and photovoltaic devices, especially those using ART technology application Ser. No. 11/857,047 filed Sep. 18, 2007 entitled "Aspect Ratio Trapping for Mixed Signal Applications"; application Ser. No. 11/861,931 filed Sep. 26, 2007 entitled "Tri-Gate Field-Effect Transistors formed by Aspect Ratio Trapping"; application Ser. No. 11/862,850 filed Sep. 27, 2007 entitled "Quantum Tunneling Devices and Circuits with Lattice-mismatched Semiconductor Structures"; application Ser. No. 11/875,381 filed Oct. 19, 2007 entitled "Light-Emitter-Based Devices with Lattice-mismatched Semiconductor Structures"; and application Ser. No. 12/100,131 filed Apr. 9, 2007 entitled "Photovoltaics on Silicon" are all hereby incorporated by reference as providing examples to which aspects of this invention may be particularly suited.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof are used to connote both direct and indirect connections/couplings. As another example, "having" and "including", derivatives thereof and similar transitional terms or phrases are used synonymously with "comprising" (i.e., all are considered "open ended" terms)-only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A semiconductor structure comprising:
   a crystalline substrate;
   an insulator having an opening to the crystalline substrate; and
   a crystalline material within the opening in the insulator, the crystalline material being lattice-mismatched with the crystalline substrate, the crystalline material having a top surface with a root mean square surface roughness of 5 nm or less, the top surface of the crystalline material being below an upper surface of the insulator.

2. The structure of claim 1, wherein the surface roughness is 3 nm or less.

3. The structure of claim 1, wherein the surface roughness is about 1 nm or less.

4. The structure of claim 1, wherein the surface roughness is no greater than 0.55 nm.

5. The structure of claim 1, wherein the opening has an aspect ratio sufficient to trap defects in the crystalline material during its growth, and further comprising a semiconductor device at least in part in the opening.

6. The structure of claim 5, wherein the aspect ratio of the opening is 1 or greater.

7. The structure of claim 6, wherein the opening is a trench.

8. The structure of claim 5, wherein a width of the opening is one of 400 nm or less.

9. The structure of claim 1 wherein the crystalline material has additional crystalline material grown upon the top surface of the crystalline material.

10. The structure of claim 1, wherein the crystalline material is a group III-V compound.

11. The structure of claim 10, wherein the group III-V compound includes one or more of the following:
    aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), indium antimonide (InSb), and their ternary and quaternary compounds.

* * * * *